United States Patent [19]

Balcerak et al.

[11] 4,115,692
[45] Sep. 19, 1978

[54] SOLID STATE READOUT DEVICE FOR A TWO DIMENSIONAL PYROELECTRIC DETECTOR ARRAY

[75] Inventors: Raymond S. Balcerak, Alexandria; Lynn E. Garn, Woodbridge, both of Va.

[73] Assignee: The United States of America as represented by the Secretary of the Army, Washington, D.C.

[21] Appl. No.: 793,688

[22] Filed: May 4, 1977

[51] Int. Cl.² .......................... G01J 1/00; G01T 1/22
[52] U.S. Cl. ..................................... 250/338; 250/370
[58] Field of Search .................... 250/370, 371, 338; 357/24, 30

[56] References Cited
U.S. PATENT DOCUMENTS 3,806,729  4/1974  Caywood .......................... 250/370

OTHER PUBLICATIONS

Steckl, Andrew J. et al., "Application of Charge-Coupled Devices to Infrared Detection and Imaging", *Proceedings of the IEEE*, vol. 63, No. 1, Jan. 1975, pp. 67-74.

Primary Examiner—Alfred E. Smith
Assistant Examiner—Janice A. Howell
Attorney, Agent, or Firm—Nathan Edelberg; Max L. Harwell; Robert P. Gibson

[57] ABSTRACT

A solid state pyroelectric detector readout device comprised of a two dimensional pyroelectric detector array which is interfaced with an array of solid state readout charge coupled devices (CCDs). The interfaced portion is comprised of current regulating means for eliminating the scene background flux and for maximizing the dynamic range of said device.

8 Claims, 5 Drawing Figures

SOLID STATE READOUT DEVICE FOR A TWO DIMENSIONAL PYROELECTRIC DETECTOR ARRAY

The invention described herein may be manufactured, used, and licensed by the U.S. Government for governmental purposes without the payment of any royalties thereon.

BACKGROUND AND SUMMARY

The pyroelectric detector offers several advantages over other detector materials for infrared (IR) systems applications. The room temperature operation and the inherent background subtraction are the most significant. Also, the presently used readout scheme for pyroelectric detectors is the vidicon tube, which utilized the electron beam readout. The electron beam read-out consumes power in heating a filament, requires large bandwidths since pixels are read out one at a time, introduces noise via the shot noise in the vidicon beam, and, due to the finite beam impedance, increases the RC time constant of the readout. Even with these disadvantages, the pyroelectric vidicon is a viable contender for the medium performance infrared imaging system.

An alternate readout scheme to overcome each of these disadvantages would greatly improve performance of the medium performance imaging system. Each of these disadvantages can be overcome by the solid state charge coupled device readout for a two dimensional pyroelectric detector array explained herein. A solid state readout that utilizes charge coupled device transfer means is a novel approach in that it capitalizes on each of the unique properties of the pyroelectric detector. Each detector in a two dimensional pyroelectric array is directly interfaced by interfacing means, such as DC current limiting means, to a two dimensional charge coupled device.

One of the primary advantages of coupling a pyroelectric element to the charge coupled device is the ability of the pyroelectric detector to reject background charge. Signals from a normal infrared scene are comprised primarily of background flux plus one to two percent signal. The large quantity of background flux produces currents, which quickly over fill CCD buckets. However, since the pyroelectric detector does not respond to the background flux, only the signal charge flows into the CCD. The CCD buckets do not saturate when the pyroelectric detector is coupled to the CCD readout chip.

DETAILED DESCRIPTION OF THE PREFERRED EMBODIMENT

Figure 1:
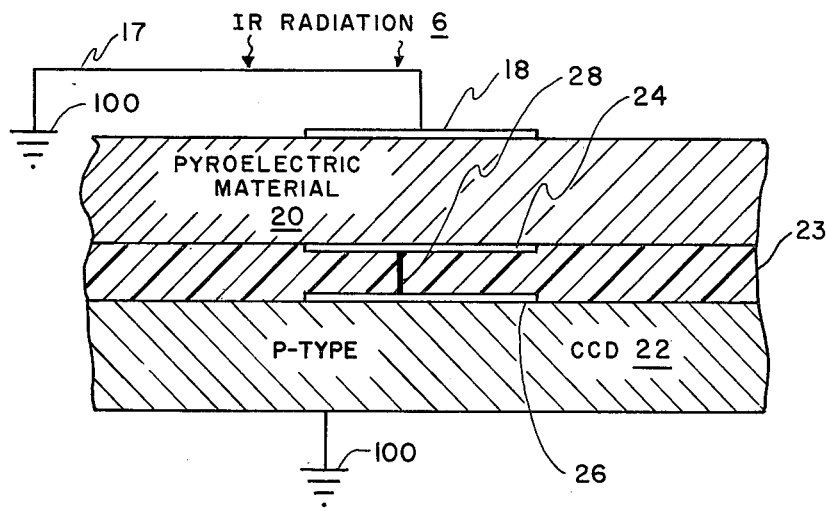
FIG. 1 illustrates an interface between a pyroelectric detector and a CCD readout.

FIG. 1 illustrates a possible interface between a pyroelectric detector 20, an optional thermal insulating layer 23, and a CCD 22. Since the pyroelectric retina 20 and CCD 22 are in thermal contact with each other, either directly or through the thermal insulating layer 23, the CCD heat sinks the retina and reduces the infrared radiation 6 signal levels below the level of unsinked retinas. This type of mounting causes serious signal attenuation in other temperature sensitive detectors which are DC coupled to infrared scenes. However, the pyroelectric retina, which responds only to temperature changes, is AC coupled to infrared scenes because its irradiance is modulated with a mechanical chopper or some other modulation technique. Therefore, there is a penetration depth associated with the modulated temperature wave in the retina. The depth to which the wave penetrates during the modulation period depends on the retina's thermal properties and the period of the modulation. For some conditions the retina thickness can exceed the penetration depth. Retinas satisfying these conditions respond the same as unsinked retinas, i.e., they do not "know" they are heat sinked. Therefore, heat sinking effects can be eliminated by adjusting the retina thickness and the modulation period. Although the best performance may require the penetration depth to be less than the retina thickness, this is not critical. Pyroelectric signals will still be generated by the retina, even though they may be severely attenuated if the penetration depth is substantially greater than the retina thickness. The thermal insulating layer 23, shown in FIG. 1, can be placed between the pyroelectric material retina 20 and CCD 22 to reduce the heat sinking effects of CCD 22. If the thermal insulating layer 23 has the right electrical properties, it may be possible to capacitively couple resolution elements or detectors of the retina 20 directly to the source input of the CCD. This would eliminate the need for a metallic electrical conductor, shown as numeral 28, between the output electrode 24 of the detectors and the input electrode 26 of the CCD source inputs. Input electrode 18 of the detectors is shown as electrically grounded at 100 by way of lead 17.

Figure 2:
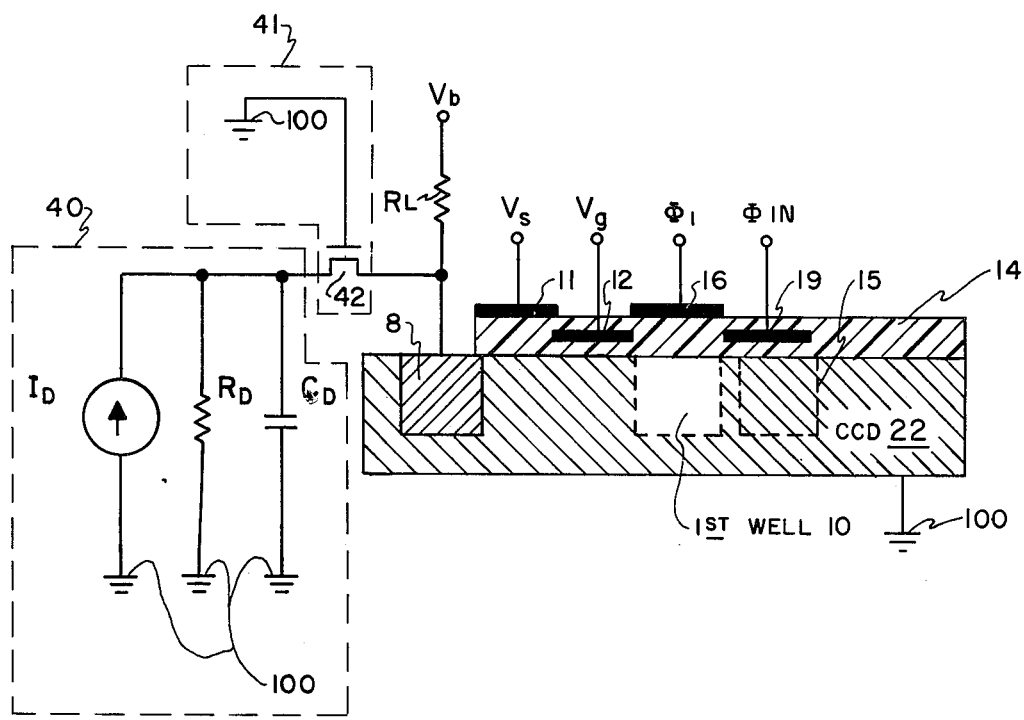
FIG. 2 shows an electric schematic of a pyroelectric detector that is interfaced directly to the source input of a CCD with an alternative ghost interface directly connected to the gate electrode.

In FIG. 2, one of the pyroelectric detector elements, represented by dashed lines 40, is shown interfaced through a buffer stage 41 directly to the source input 8 of the CCD. An alternative direct connection to the gate electrode 12 may also be made. If buffer 41 were directly coupled to the source input 8, the DC bias current flowing from bias supply voltage $V_b$ through resistor $R_L$ would flow directly to the first CCD well 10 and possible overfill well 10. However, when buffer 41 is directly coupled to the gate electrode 12, no direct current can flow into the CCD gate since it is a very high impedance of about $10^{14}$ to $10^{15}$ ohms. Element 40 is represented electrically by detector current ID, detector resistance RD, and detector and CCD stray capacitance CD. The buffer stage 41 may be, as examples, either an in-line bipolar transistor or MOSFET 42. Functionally, while the CCD input gate voltage $\phi_{IN}$, which is connected to input gate 19, is kept in its "off" state of about 0 volts the source well 8 and electrodes 11, 12, and 16 are kept in their "on" states by proper application of voltage $V_b$, $V_s$, $V_g$, and $\phi_1$ respectively. The CCD 22 material is assumed to be P-type material for explanation but is not limited thereto. In the on state, $V_b$ is about +1 to +2 d.c. volts, $V_s$ and $V_g$ are about +8 d.c. volts, and $\phi_1$ is about +10 d.c. volts. In this "off" state condition for voltage $\phi_{IN}$, the pyroelectric detector 40 integrates signal charge through the source input 8 and into the first well 10 which is formed under electrode 16 because of the +10 d.c. volts thereon that attracts electrons from electron-hole pairs in the P-type substrate material of the CCD 22. The P-type substrate material is at ground potential. The signal charge stored in the first well 10 after the pyroelectric detector signal integration time is read out by simultaneously lowering the $\phi_1$ voltage from +10 d.c. volts to 0 volts and raising the $\phi_{IN}$ voltage from 0 volts to +10 d.c. volts. The signal charge under electrode 16 is thus dumped from the first well 10 into a second well 15 created under electrode 19. The potential of the $\phi_1$ voltage on electrode 16 is then raised again from 0 to +10 d.c. volts and simultaneously voltage $\phi_{IN}$ is lowered from +10 d.c. volts to 0 volts to integrate the next charge packet while the charge under electrode 19 is clocked out of the CCD structure 22 in a manner explained later in this application with reference to FIGS. 4 and 5. The voltage of several $\phi_1$ voltages may be lowered simultaneously, thus reading out as many detectors as desired. For example, an entire row of $\phi_1$ voltages and $\phi_{IN}$ voltages may be simultaneously switched. There may be about two hundred interfacing detectors 40 and source inputs 8 to each column, and also two hundred to each row. This approach decreases the readout bandwidth by the number of detectors read out at one time. Since the noise of a particular input scheme is dependent strongly on bandwidth, a decrease in readout bandwidth provides a considerable advantage over the wide bandwidth readout approach of the vidicon.

As each column of pyroelectric detectors 40 is read out by the charge coupled device 22, the information may be multiplexed and displayed on a CRT or used to address in parallel one column of a matrix display. A readout scheme is explained herein below with reference to FIGS. 4 and 5.

An additional unique advantage of interfacing pyroelectric detectors to the CCD is the inherent AC coupling in the pyroelectric detector element. Since a pyroelectric detector responds only to changes in temperature, the background radiation from the scene produces no signal current in a pyroelectric detector. This is a distinct advantage over other infrared detector/CCD interfaces since, in other detectors, a background current is generated which contains no signal information and must only be subtracted from the CCD well. The pyroelectric/CCD interface eliminates the necessity for any CCD background subtraction technique. Some DC current however must be supplied to the CCD to increase the transconductance (gm) of the input stage. This bias current is supplied through resistor RL and is controlled by the bias supply voltage $V_b$ that is connected thereto. This additional DC current supplied to the CCD input must subsequently be subtracted from the CCD well.

Figure 3:
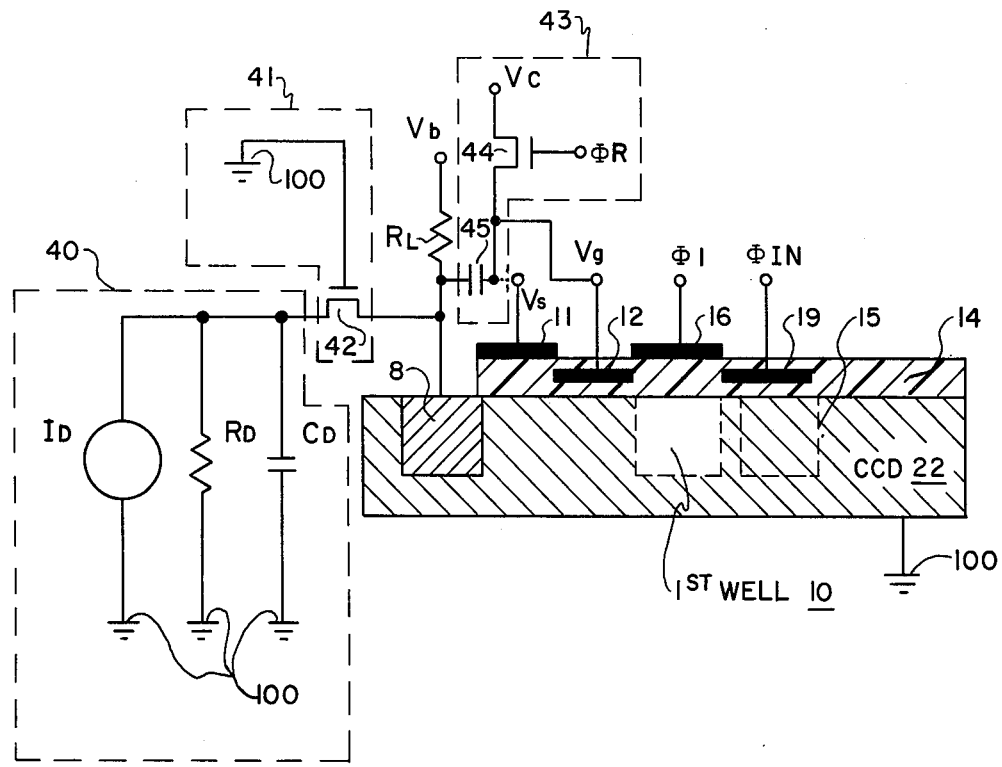
FIG. 3 shows an electrical schematic detector that is AC coupled to the gate electrode of a CCD with an alternative ghost AC connection to the source input.

In order to limit the amount of DC current supplied to the input source 8, the single stage buffer 41 is placed between the detector 40 and CCD 22. Buffer 41 may be directly coupled to the input source 8 or to the gate electrode 12 of the CCD as explained herein above. Alternatively, buffer 41 may be AC coupled to either the gate 12 or source 8 inputs. When buffer 41 is used, the resistor $R_L$ is the load resistor for the buffer stage and $V_b$ is the bias supply voltage. FIG. 3 illustrates the embodiment comprising AC coupling. The AC coupled circuit is included within dashed lines 43 and is comprised of a capacitor 45 directly connected to the gate electrode 12, or alternatively ghost connected to the source input voltage $V_s$, and a reset MOSFET 44 that switches a voltage $V_c$ by a $\phi_R$ voltage on the MOSFET 44 gate. In the AC coupled approach, the reset MOSFET 44 is included to maintain a stable d.c. voltage on the CCD input. This is done by pulsing the MOSFET gate with the $\phi_R$ voltage and thus establishing the $V_c$ potential on the CCD input.

The solid state interface between the CCD and the pyroelectric detector also reduces the stray capacitance between the detector and the readout electronics. The only capacitance in the interface is the physical capacitance of the detector and readout device. Stray wiring capacitance is not dominant in a solid state interface as it is in other interfaces. The reduction of interface capacitance reduces the noise considerably.

Figure 4:
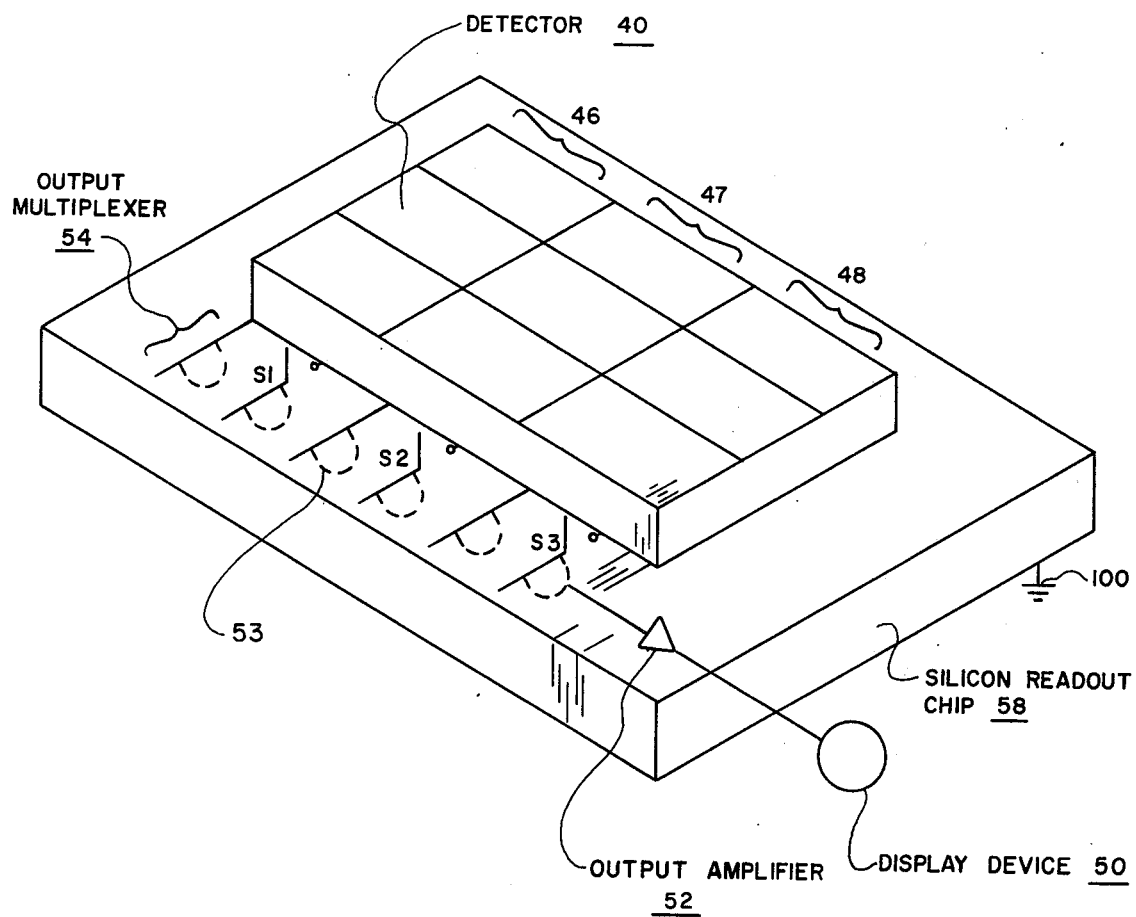
FIG. 4 illustrates a schematic perspective of the readout chip with the detector array visible.
Figure 5:
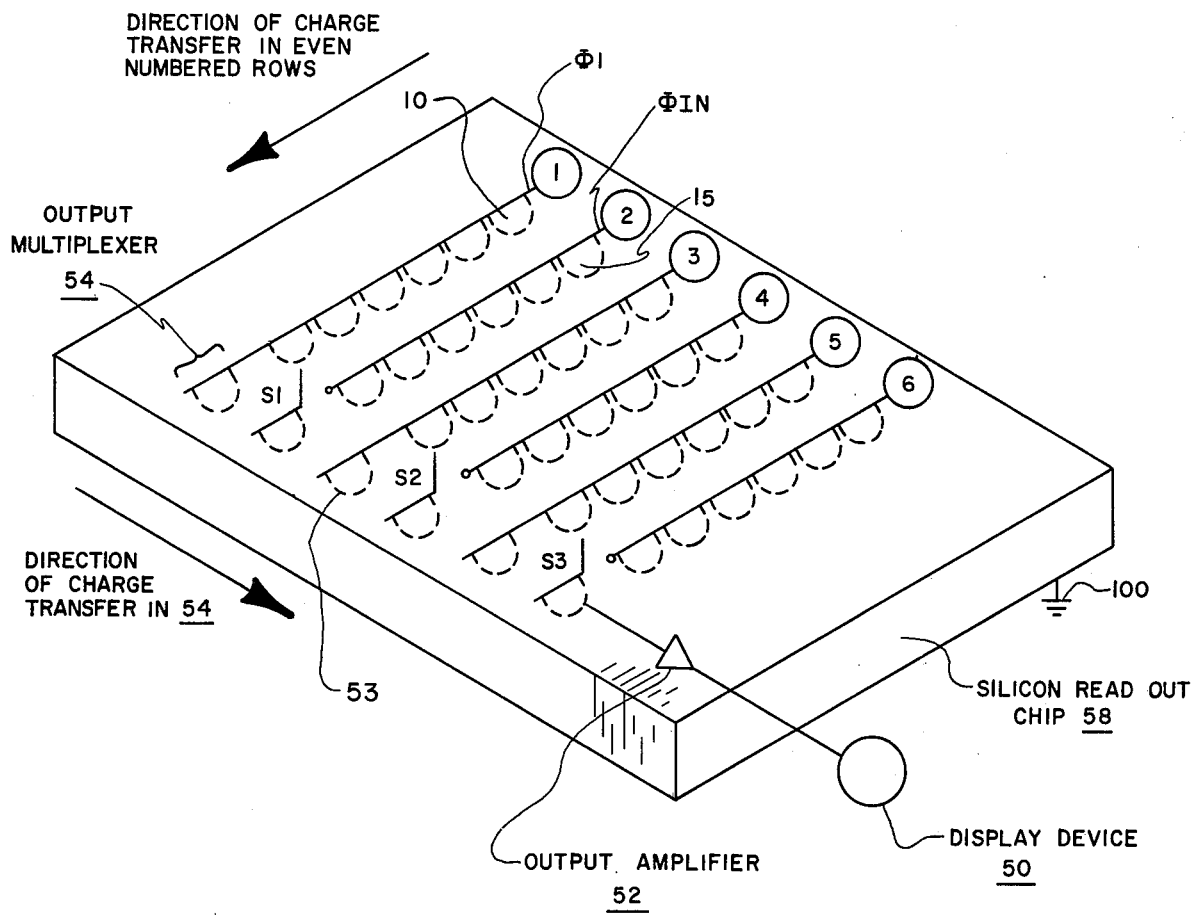
FIG. 5 shows the same perspective as does FIG. 4 but with the detectors removed and the CCD structure shown.

FIG. 4 illustrates a 3 column by 3 row array of pyroelectric detectors 40 mounted on a silicon readout chip semiconductor substrate 58. The silicon readout chip 58 contains the CCDs that have each of their inputs directly interfacing with each of the detectors 40. All of the CCD wells except the output multiplexer 54 are hidden in FIG. 4 but are shown in FIG. 5. Refer now to FIG. 5 in addition to FIG. 4 for an explanation of the present readout method. The detectors 40 are not shown in FIG. 5 to better illustrate the CCD operation but are assumed to be present and to interface with the input sources of the CCD. The input sources are represented by numerals 1, 3, and 5 and are further shown as voltage $\phi_1$ and wells 10 as indicated by FIGS. 2 and 3. The input source signal charges that are integrated into the wells 10 are read out by voltage $\phi_{IN}$ dumping the signal charges from the first wells 10 into the second wells 15.

Operation of the solid state readout is as follows. The three rows of pyroelectric detectors 40, which are shown as 46, 47, and 48 in FIG. 4, are connected to rows 1, 3, and 5 in FIG. 5, which are the input sources of the CCDs. The CCDs are formed in the solid state readout chip 58. Signal charges from the detectors are integrated in the first wells 10 formed in each of these rows of the CCD. After the integration time, the proelectric detector signal signal charge is transferred simultaneously from the odd numbered rows 1, 3, 5 to the even numbered rows 2, 4, and 6 respectively. Signal charges from the pyroelectric detectors 40 are then free to integrate into the odd numbered rows again while the charge is being transferred through the even rows to the output multiplexer charge wells 53 of the output multiplexer 54 by a switching means comprised of switches S1, S2, and S3 being closed. The output multiplexer 54 is also a charge coupled device. Switches S1, S2, and S3 are closed simultaneously as each packet of charge is shifted down the even numbered row wells 53. The multiplexer accepts charge packets through switches S1, S2, and S3 and then the switches open as the charge is shifted down the output multiplexer 54 to the output amplifier 52 for display on some display device 50. The charge must be completely transferred out of the multiplexer before the switches S1, S2, and S3 are closed again to accept charge from the even numbered rows.

The unique advantages of this readout mechanism over other approaches are:

1. The readout bandwidth may be decreased by reading out an entire column of detectors simultaneously.

2. The pyroelectric detector/CCD interface automatically eliminates scene background flux.

3. By providing a solid state buffer amplifier between the pyroelectric detector and the CCD, the need for excessive DC current to increase CCD transductance is eliminated. This allows the CCD well to be almost entirely filled with signal information, thereby, maximizing dynamic range.

4. By reducing the capacitance of the detector/electronics interface, the solid state readout improves the noise performance.

5. Heat sinking of the pyroelectric retina of the CCD can be substantially reduced or eliminated by adjusting the retina thickness and the IR modulation frequency. Heat sinking effects can also be further reduced or eliminated by placing a thermal insulating layer between the pyroelectric retina material and CCD.

6. By utilizing the integration capability of the CCD processor, the thermal modulation period may be decreased while the integrated charge read off the CCD focal plane is the signal from a longer effective modulation period. The shorter modulation period minimizes the signal loss thru conduction to the silicon substrate and maximizes resolution.

The charge coupled device read out technique offers unique signal processing advantages which facilitate the thermal interface of pyroelectric material with silicon and also enhance the detector performance. The signal attentuation caused by mounting the temperature sensitive pyroelectric detector on the silicon CCD substrate can be minimized by decreasing the thermal modulation period. With a shorter modulation period, the pyroelectric signal is read out of the detector before it is lost in the silicon substrate. However, since the modulation period is shorter, less signal is intergrated by the detector. The effect of a longer intergration time may be simulated in the CCD by utilizing its unique processing capability. If the signals from each of the short modulation periods are added (integrated) in a CCD well, the signal in the integrating well will be the effective signal from a long integration time. The detector will be exposed to radiation for a short time, but the signal readout of the CCD will be the sum of signals from several short integration times. In addition to the benefit of minimizing signal loss to the silicon substrate, there is also less lateral heat spread in the detector material in the shorter modulation period. Consequently, the resolution increases as the modulation period decreases. The integration can be implemented by allowing charge from several short modulation periods to add in the 1st well 10 formed under gate 16 before it is transferred into the CCD well formed under gate 19.

While particular embodiments of the invention have been shown and discussed, it will be understood that the invention is not limited thereto, since many modifications may be made and will become apparent to those skilled in the art.

We claim:

1. A solid state pyroelectric detector readout device comprising:
 a readout chip semiconductor substrate having charge coupled device transfer means deposited on one surface thereof, wherein said charge coupled device transfer means is comprised of an array of solid state readout charge coupled devices having individual source inputs;
 a pyroelectric retina comprised of a two dimensional pyroelectric detector array that has a scene modulated thereon for absorbing infrared radiation and producing a signal charge pattern therefrom during thermal modulation periods, wherein each of the pyroelectric detector elements of the two dimensional pyroelectric detector array is directly interfaced with one of the individual source inputs of said array of solid state readout charge coupled devices; and
 interfacing means between said two dimensional pyroelectric detector array and said individual source input wherein the intergration capability of said charge coupled device transfer means allows short thermal modulation periods for minimizing the pyroelectric detector signal losses through thermal conduction to said semiconductor substrate for eliminating the scene background flux and maximizing the dynamic range of said readout device.

2. A device as set forth in claim 1 wherein said interfacing means is a thermal insulating layer that reduces the heat sinking effects of said charge coupled device transfer means.

3. A device as set forth in claim 2 wherein said interfacing means further comprises a single stage buffer amplifier that is direct coupled to the source inputs of said charge coupled device to limit DC current to the input of said charge coupled device transfer means.

4. A device as set forth in claim 3 wherein said single stage buffer amplifier is a MOSFET that is phase switched in phase with the scene charge on said pyroelectric retina.

5. A device as set forth in claim 3 wherein said single stage buffer amplifier is a bipolar transistor that is phase switched in phase with the scene charge on said pyroelectric retina.

6. A device as set forth in claim 2 wherein said interfacing means further comprises a single stage buffer amplifier that is AC coupled through an AC coupled circuit to the gate of said charge coupled device to limit DC current to the input of said charge coupled device transfer means.

7. A device as set forth in claim 2 wherein said readout chip semiconductor substrate is a P-type material and said charge coupled device transfer means is comprised of a plurality of source inputs and a plurality of rows of first wells adjacent thereto and a plurality of rows of second wells adjacent to said plurality of rows of said first wells wherein each of said plurality of source inputs are interfaced with a pyroelectric detector of said two dimensional pyroelectric detector array, said charge coupled device transfer means further having selective voltage switching means connected to said plurality of said source inputs and said plurality of rows of first wells and said plurality of rows of second wells for selectively storing and transferring out said signal charge pattern to an output multiplexer for directing said signal charge pattern to a display device.

8. A device as set forth in claim 7 wherein said output multiplexer is a charge coupled device having a plurality of output multiplexer charge wells with each alternate of said plurality of output multiplexer charge wells connected to one end of each of said plurality of rows of said second wells through a switching means wherein said signal charge pattern is transferred by said selective voltage switching means from all of said plurality of rows of first wells to all of the adjacent of said plurality of rows of second wells simultaneously and said signal charge pattern is then connected to each alternate of said output multiplexer charge wells by said switching means to sweep out said charge pattern to said display device.

* * * * *